United States Patent [19]
Funayama et al.

[11] Patent Number: 5,527,398
[45] Date of Patent: Jun. 18, 1996

[54] MAGNETOSTRICTIVE MATERIALS AND METHODS OF MAKING SUCH MATERIALS

[75] Inventors: Tomomi Funayama; Tadahiko Kobayashi; Isao Sakai; Masashi Sahashi, all of Kanagawa-ken, Japan

[73] Assignee: Kabushiki Kaisha Toshiba, Kanagawa-ken, Japan

[21] Appl. No.: 140,308

[22] Filed: Oct. 22, 1993

Related U.S. Application Data

[62] Division of Ser. No. 830,569, Feb. 4, 1992, Pat. No. 5,336,337.

[30] Foreign Application Priority Data

Feb. 5, 1991 [JP] Japan .................. 3-35522
Mar. 27, 1991 [JP] Japan .................. 3-62333
Oct. 15, 1991 [JP] Japan .................. 3-265663

[51] Int. Cl.⁶ .................. H01F 1/03; H01F 1/053
[52] U.S. Cl. .................. 148/101; 148/120
[58] Field of Search .................. 148/101, 100, 148/120

[56] References Cited

U.S. PATENT DOCUMENTS

4,609,402  9/1986  McMasters .
4,770,704  9/1988  Gibson et al. .
5,067,551  11/1991  Murakami et al. .................. 164/122.2
5,110,376  5/1992  Kobayashi et al. .................. 148/301

FOREIGN PATENT DOCUMENTS

282059    9/1988   European Pat. Off. .
0405362   1/1991   European Pat. Off. .
60-9855   1/1985   Japan .................. 420/416
61-33892  2/1986   Japan .
62-109946 5/1987   Japan .
63-2424422 10/1988 Japan .

*Primary Examiner*—John Sheehan
*Attorney, Agent, or Firm*—Finnegan, Henderson, Farabow, Garrett & Dunner

[57] ABSTRACT

The magnetostriction alloys of the present invention are composed basically of Tb—Dy-iron which is partially substituted by at least one element selected from the group consisting of Y, La, Ce, Pr, Nd and Sm, and have been grown in the direction of face index <110> or contain Mn and M element (at least one metallic element selected from the group consisting of C, Mg, Al, Si, Ca, Zr, Y, Ga and B. The magnetostrictive alloy may be formed by melting the constituent materials by high frequency induction dissolution. The molten materials are cast in a heated mold having a temperature gradient. The solidified material may be further treated by hot working.

16 Claims, 6 Drawing Sheets

MAGNETOSTRICTIVE MATERIALS AND METHODS OF MAKING SUCH MATERIALS

This is a division of application Ser. No. 07/830,569, filed Feb. 4, 1992 now U.S. Pat. No. 5,336,337.

BACKGROUND OF THE INVENTION

1. Field of the Invention

The present invention relates to a magnetostrictive alloy having a high coefficient of magnetostriction, and more particularly to a magnetostrictive alloy which is suitable for use as a primary element of a device designed to convert magnetic energy to mechanical energy and vice versa.

The present invention also relates to methods of producing the magnetostrictive alloy mentioned above.

2. Description of the Related Art

Magnetic materials are deformed by magnetostriction when an external magnetic field is impressed. Applying this effect, magnetic-mechanical displacement conversion devices (hereinafter referred to as "devices") have been developed. In the vibration field these devices are, magnetostriction vibrators, applicable to speakers, sonars, ultrasonic delay lines, ultrasonic processing machines, vibration-preventive and vibration-isolating mechanisms, and the like. In the mechanical application field they are used in displacement control actuators, precision positioning mechanisms, control valves, mechanical switches, micro pumps, printer heads, and the like. Furthermore, as sensors, they are also used in pressure sensors, knock sensors, sound pressure sensors, and the like. In addition, they are also applicable to devices using elastic surface waves. Thus, magnetostriction materials are extremely useful in the industrial field.

As magnetostriction materials used for these devices, Ni-base alloys, Fe—Co alloys and ferrite materials are known. Recently, rare earth-iron intermetallic compounds of the Laves type (expressed by the general expression $AB_2$ having the cubic crystal structure $MgCu_2$, and having a saturated magnetostriction of $1000 \times 10^{-6}$ or more) have been reported (Japanese Patent Publication TOKKU-KO-SHO No. 61-33892). The compounds of the present invention have a greater absolute quantity of magnetostriction than the conventional magnetostriction materials mentioned above.

Recently the magnetostrictive alloy rods have been manufactured by the floating zone refining method (Japanese Patent Disclosure TOKKU-KAI-SHO No. 62-109946 or U.S. Pat. No. 4,609,402) and the improved type Bridgman method (Japanese Patent Disclosure TOKKU-KAI-SHO No. 63-242442 or European Open Patent No. 282059) to form a magnetostrictive alloy having a large magnetostriction. Such methods, however, form the magnetostriction alloy into parts that are relatively small in diameter, only rod shaped and at a high manufacturing cost. Such methods are, therefore, not adequate for mass production.

Moreover, to be practically useful such materials should exhibit large magnetostriction in a magnetic field as low as several kOe. In such a low magnetic field, magnetostriction alloys having satisfactory magnetostrictive characteristics consisting of the rare earth-iron system alloys have not yet been developed.

The present invention has been made in view of the circumstances described above. It is an object of the present invention to provide magnetostrictive alloys that show large magnetostriction even in a low magnetic field.

It is a further object of the present invention to provide a method of making the magnetostrictive alloys mentioned above.

SUMMARY OF THE INVENTION

These, and other objects of the invention are achieved by means of the present invention. According to the present invention, there is provided a magnetostrictive alloy comprised of a composition whose atomic ratio is expressed by:

$$Tb_x R_y Dy_{1-x-y} (Fe_{1-z} Mn_z)_w$$

where $x+y<1$, $0.005 \leq y \leq 0.9$, $0.005 \leq z \leq 0.5$, $1.5 \leq W \leq 2.5$ and R is at least one element selected from the group consisting of Y, La, Ce, Pr, Nd and Sm. Preferably, the alloy exhibits a value of magnetostriction in excess of 500 ppm. It is further preferred that the alloy is comprised of the Laves phase and exhibits magnetostriction in magnetic fields of less than 2 kOe.

According to the present invention, there is provided a method of how to form a magnetostrictive alloy of the present invention. The method includes the step of casting the alloy in a heated mold that is provided with a temperature gradient. The alloy is solidified in the mold to form a solidified alloy. The method preferably includes the step of plastically deforming the solidified alloy by hot working.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings wherein.

DESCRIPTION OF THE PREFERRED EMBODIMENTS

Figure 1:
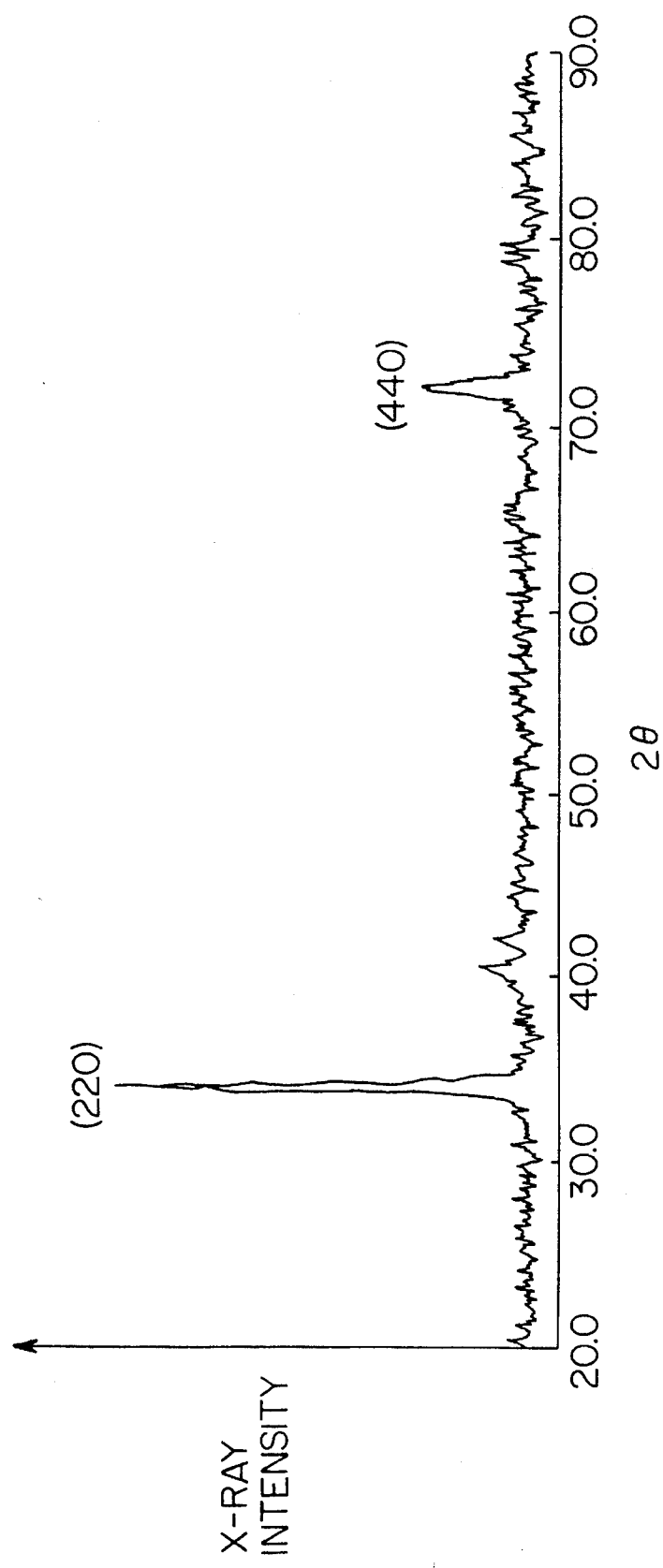
FIG. 1 is a graph showing the X-ray patterns of the magnetostrictive alloy of example 28 including the present invention.

The magnetostrictive alloy according to the first embodiment of the present invention has a composition whose atomic ratio is expressed by $$Tb_x R_y Dy_{1-x-y} (Fe_{1-z} Mn_z)_w$$

the ranges of x, y, z and w as follows:

$x+y<1$, $0.005 \leq Y \leq 0.9$, $0.005 \leq z \leq 0.5$, $1.5 \leq w \leq 2.5$ and R is at least one element selected from the group consisting of: Y, La, Ce, Pr, Nd and Sm. The elements Tb and Dy belong to the lanthanum system, and differ from such 3d transition elements as Fe, Ni and the like, because they have extremely large magnetic anisotropy due to the strong orbital angular momentum of their 4f electrons. Therefore they become the base to display the large magnetostrictive characteristic. Further, the R element is relatively easy to obtain, such as Pr and the like. When expensive Tb and Dy are partially substituted by this R element, then the magnetic anisotropy of these rare earth atoms changes and the magnetostrictive characteristic in the low magnetic field is improved.

Fe forms Laves-type intermetallic compounds (Laves phase) with such earth elements as Tb, Dy and R element and these compounds have displayed a remarkably high magnetostrictive characteristic. Further, if Mn is included for some of the Fe, the magnetostriction anisotropy of rare earth elements changes and these Laves-type intermetallic compounds show excellent magnetic characteristics not only in a high magnetic field but also in a low magnetic field.

The elements of Tb, R, Dy, Fe and Mn of the magnetostrictive alloy involved in the first embodiment are specified by the ratio of atoms x, y, z and w. The reason for setting x+y<1 is because Dy is an essential element for the first embodiment. Tb is effective to produce the magnetostrictive property in an amount of 0.050 or more. If, however, x is more than 0.5 the magnetostrictive propery is decreased. It is, therefore, preferred that the value of x be 0.5 or less. Further, if y is less than 0.005, the influence of an R atom on the magnetic anisotropy described above becomes insufficient, while if it is more than 0.9, the Laves phase which seems to correlate with improved magnetostriction characteristics decreases and an undesirable 1-3 phase is formed. This 1-3 phase is a crystal structure in the ratio of rare earth and iron at 1:3, and has an extremely small magnetostriction. Both of these factors lead to deterioration of the magnetostriction characteristic.

On the other hand, if z is less than 0.005, the influence of Mn on the above-mentioned magnetic anisotropy becomes insufficient, while if z is more than 0.5, the Curie temperature drops. Both of these factors lead to deterioration of the magnetostriction characteristic. Furthermore, if w is less than 1.5 or more than 2.5, the Laves phase, which should become the primary phase, is decreased and the magnetostriction characteristic drops.

It is also possible to substitute part of Fe with T element (T=Co, Ni) to improve the corrosion resistance of this magnetostriction alloy. However, excessive substitution results in a drop of the Curie temperature and deterioration of the magnetostriction characteristic. Therefore, the substitution in the formula $Fe_{1-a}T_a$ (a indicates the substitution quantity) should be in the range of from $0 \leq a \leq 0.5$.

In addition, to improve the material strength, the saturated magnetostriction and the corrosion resistance of this magnetostriction alloy it is possible to substitute part of Mn with M' element (M' is at least one of the elements selected from the group consisting of: Mg, Al, Ga, Ru, Rh, Pd, Ag, Cd, In, Sn, Sb, Os, Ir, Pt, Au, Hg, Tl and Pb). However, if the substitution quantity is excessive, the magnetostriction characteristic is deteriorated. Therefore, the substitution in the formula $Fe_{1-z-zz} Mn_z M'n_{zz}$ (zz indicates the substitution quantity) should be in the range of from $0 \leq zz \leq 0.2$.

If the magnetostrictive alloy involved in the first embodiment is oriented preferentially in one of the specific crystallographic directions <110> or <111> of the cubic system, the magnetostrictive characteristic in this orientation is larger than that in other directions.

In the second embodiment involved in the present invention, the magnetostrictive alloy RE $Fe_p$ ($1.5 \leq p \leq 2.5$) forms the above-mentioned Laves type intermetallic compound. The rare earth element (RE) is selected from the group consisting of the elements: Y, La, Ca, Pr, Nd, Pm, Sm, Eu, Gd, Tb, Dy, Ho, Er, Tm, Yb and Lu. Such an alloy and has been grown in the <110> crystal direction.

Both single and multiple crystals of this rare earth-iron magnetostriction alloy readily grow in the <110> crystal direction. Therefore, when these alloys are formed in the shape of a rod to use them in devices, if they are manufactured by having them grow in the <110> direction using the floating zone refining method (ie. formed gradually by moving the heating zone) or by casting with a temperature gradient, the manufacturing time is shortened. In case of the floating zone refining, it is possible to substantially reduce the number of heating cycles. The magnetostriction alloy RE $Fe_p$ ($1.5 \leq p \leq 2.5$) manufactured with the crystal direction arranged in the <110> direction displays high magnetostriction characteristics even in a low magnetic field. When the atomic ratio p is less than 1.5, a rare earth rich phase increases, and when p is more than 2.5, the Laves phase decreases. Both of these conditions lead to deterioration of the magnetostriction characteristic.

In the case of the magnetostriction alloy involved in the second embodiment including the element of Fe as shown by the formula RE $(Fe_{1-c}Mn_c)_p$ ($1.5 \leq p \leq 2.5$, $0.005 \leq c \leq 0.5$), the preferential crystal growth in the direction <110> can be promoted because the Fe element is substituted by Mn in atomic ratio c. If the atomic ratio c is less than 0.005, this effect may not be obtained, while if it exceeds 0.5, the Curie temperature drops and the magnetostriction characteristic is deteriorated.

The magnetostriction alloy of the second embodiment can obtain the same effects of the first embodiment if at least one of T elements (T=Co, Ni) or M' elements (Mg, Al, Ga, Ru, Rh, Pd, Ag, Cd, In, Sn, Sb, Os, Ir, Pt, Au, Hg, Tl and Pb) are included in the same substitution quantity.

Moreover, if the easy magnetizing axis and the crystal axis are in the same direction, excellent magnetostriction is obtained, especially in a low magnetic field. Therefore it is desirable that the crystal having the <110> easy magnetizing axis is grown in the <110> direction. When the crystal is grown in the <110> direction, the crystal forms in the shape of a sheet. In such a case, the structure of the crystal may also be arranged in the direction of <111>, which is perpendicular to the <110> direction. Thus portions of the alloy crystallized in the <111> direction are obtainable from an alloy grown in the <110> direction. In this case, the easy magnetizing axis in the <111> direction is desirable from the viewpoint of magnetostriction characteristics.

The third embodiment of the present invention includes the elements of Fe and Mn as shown by the formula RE $(Fe_{1-q-r}Mn_qM_r)_s$ where RE is the same as in the second embodiment and M is at least one of the group consisting of C, Mg, Al, Si, Ca, Zr, Y, Ga and B and $0.005 \leq q \leq 0.5$, $0.005 \leq r \leq 0.2$, $1.90 \leq s \leq 2.10$. The third embodiment has the same rare earth-iron Laves phase as described above. A portion of the element Fe of this magnetostrictive alloy has been partially substituted by the element Mn. In this composition the separation of the 1-3 phase, that could not be avoided when forming Laves type intermetallic compounds, is suppressed to 5 volume % or less. Such alloys are immediately usable without performing lengthy homogenizing treatments to eliminate undesirable segregation of other undesirable phases. The element M has the effect of suppressing the 1-3 phase preferentially and assists the function of Mn described above. Further, it is also possible to include M' elements within the range of the same atomic ratio as M elements.

If the atomic ratio q is less than 0.005, the 1-3 separation suppression effect is not obtained, while if it is above 0.5, the Curie temperature drops and the magnetostriction characteristics deteriorate. Further, if the atomic ratio r is less than 0.005, the effect of M elements described above is not obtained, while if it is above 0.2, the magnetostriction effect decreases.

Further, if the atomic ratio s is less than 1.9, the 1-3 phase is scarcely present even when Mn is not contained but a rare earth rich phase increases. If it is above 2.1, the 1-3 phase suppressing effect of Mn is not obtained.

The same effect can be obtained in the third embodiment as in the magnetostriction alloys of the first and second embodiments when T element (T=Co, Ni) in the same substitution quantity is contained. In addition, it is also possible to include the above-mentioned M' elements within a range as described above without impairing the magnetostriction characteristics. Like the magnetostriction alloy of the first embodiment, when the third embodiment is arranged mainly in the directions of <110> and <111> the magnetostriction characteristic is better than that in other directions.

If this alloy is used as the seed alloy in crystal growing techniques it is easy to perform the unidirectional solidification that orients the crystal direction during the manufacture of single crystals.

In the present invention the preferential crystal growth in the direction of <110> is defined as follows.

When an X-ray is impinged on the facet of the crystalline material which is perpendicular to the growing axis of the crystalline material, the peak intensity of the diffracted beam from the <220> facet is described as $I_{220}$. When the X-ray is impinged on powder material of the same composition, the maximum peak intensity of the <311> diffraction is described as $I_{311}$. Then the preferential crystal growth in the direction of <110> (shown as Px) is defined as the ratio of $I_{220}$ to $I_{311}$.

The material arranged in the <110> direction has the Px value of 1 or more, i.e., $$Px = I_{220}/I_{311} \geq 1$$

In the present invention the preferential crystal growth in the direction of <111> is defined as follows.

When an X-ray is impinged on the facet of the crystalline material which is perpendicular to the growing axis of the crystalline material, the peak intensity of the diffracted beam from the <222> facet is described as $I_{222}$. When the X-ray is impinged on powder material of the same composition, the maximum peak intensity of the <311> diffraction is described as $I_{311}$. Then the preferential crystal growth in the direction of <111> (shown as Px) is defined as the ratio of $I_{222}$ to $I_{311}$.

The material arranged in the <111> direction has the Px value of 1 or more, i.e., $$Px = I_{222}/I_{311} \geq 1$$

When the Px value of a material is Y or more, then it is said that the material is aligned in the direction of <111>.

The invention further includes a method of making a magnetostrictive alloy. The method, which will be described in detail below generally involves the casting of a material for a magnetostrictive alloy in a heated mold having temperature gradient.

This method can be applicable to not only the materials disclosed above but also other alloys. The rare earth-iron system Laves type intermetallic compounds are preferable. Such compounds are expressed by the formula:

RE Fe

where RE is at least one of the rare earth elements, which are La, Ce, Pr, Nd, Pm, Sm, Eu, Gd, Tb, Dy, Ho, Er, Tm, Yb and Lu.

If R element is a combination of more than 2 kinds of rare earth elements, use of Tb—Dy, Tb—Ho, Tb—Pr, Sm—Yb, Td—Dy—Ho, Tb—Dy—Pr, Tb—Pr—Ho and the like is desirable.

It is possible to substitute a part of Fe by Co and, in addition, Fe may be substituted partially by Mn.

Moreover, to improve mechanical strength, corrosion resistance, saturated magnetostriction, etc. of the material, Fe may be partially substituted by Ni, Mg, Al, Ga, Zn, V, Zr, Hf, Ti, Nb, Cu, Ag, Sn, Mo, Cr, Ta, Pd, In, Sb, Ir, Pt, Au, Pb, W, Si, B and the like in addition to Co and Mn. Quantities of elements for substituting Fe should, however, be limited to about 50 at % including that of Mn. If this limit is exceeded, a deterioration of characteristics including a decrease in magnetostriction may occur.

Preferable the atomic ratio X of RE element and Fe is $1.5 \leq X \leq 2.5$. This is because sufficient magnetostriction cannot be obtained if this ratio is below 1.5 or over 2.5. The most desirable range is $1.7 \leq X \leq 2.2$. A method of forming such a material is set out below.

First, a rare earth and Fe are blended at the prescribed atomic radio and Co and Mn may be added as desired. These materials are dissolved by a high frequency induction melting method. Ingots having a uniform crystalline form and a desired crystalline alignment can be produced by casting the molten alloys in a heated mold with temperature gradient. This is because the crystal nucleates and grows from the low temperature part of the melt. The preferential crystal growth is directed toward the high temperature portion of the melt and the crystal growing directions become ordered. On the other hand, if cast in a mold heated without a temperature gradient, as is done in the prior art, the many crystals began to be produced on the whole surface of the mold and the crystals grow in random directions. Therefore the crystal directions in such cast materials could not be controlled.

Further, using the temperature gradient casting method low manufacturing cost is possible as is mass production. In addition, using such a method the magnetostrictive material can be formed into a desired shape.

Figure 4:
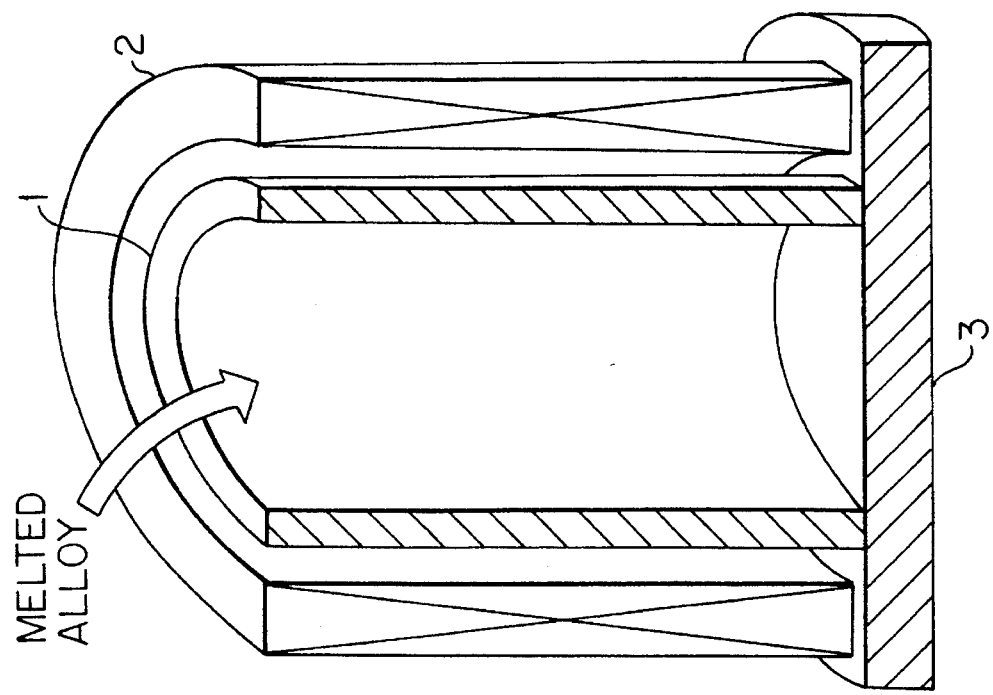

One example of such a mold is shown in FIG. 4. Mold 1 is equipped with heater 2 to heat its sides and it further includes cooling plate 3 at the bottom. The direction of pouring molten material into the mold is shown by the arrow. By heating the sides of the mold 1 by heater 2 and cooling the bottom with the cooling plate 3, it becomes possible to give a temperature gradient between the top and the bottom of mold 1 and to make the crystal direction uniform in the direction from the bottom to the top of an alloy ingot.

In addition, the effect of controlling the crystal directions of an ingot is enhanced by providing a narrow opening in the bottom of the mold. Examples of such molds provided with such openings 6a–d in the "cold" end of the mold are shown in FIG. 5. For example, in FIG. 5a, mold 4 has cooling plate 5 at the bottom. The cool end of the mold has an opening 6a contacting cooling plate 5.

Using such a mold with the alloys disclosed above results in the following: the mold is heated with a temperature gradient provided with the cooling plate 5 at a temperature lower than the sides of the mold. Molten alloy is poured into the mold and initial crystals are produced in random directions from the cooling end 5 in the opening 6a. When these initial crystals grow, the crystals growing in different directions negate each other and an alloy of which crystal directions grown in one direction only can be obtained.

Figure 5A:
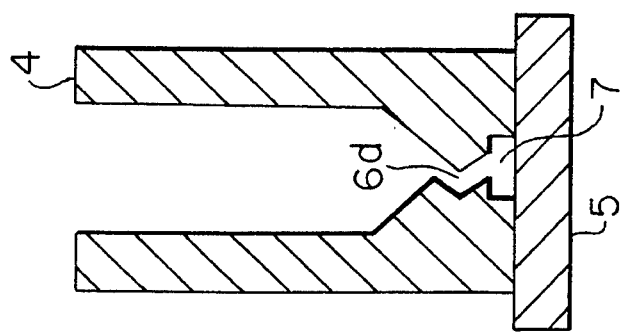
Figure 5B:
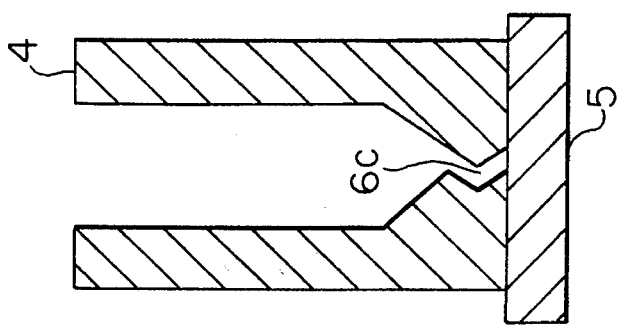
Figure 5C:
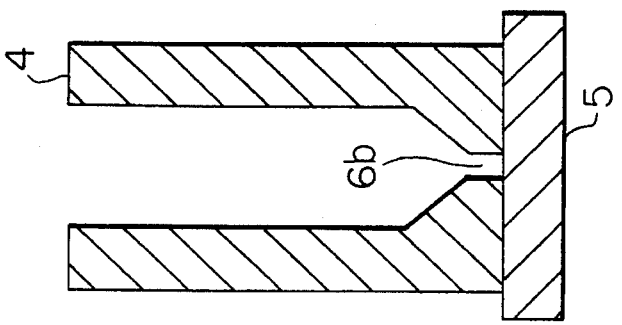
Figure 5D:
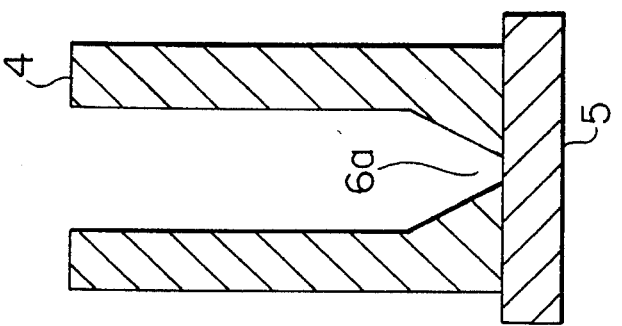

Using a mold 4 having an opening 6b in the cooling end with a length shown in FIG. 5b, or using mold 4 having a bent opening 6c shown in FIG. 5c results in the selective growth of the crystalline material as it solidifies in such an arrangement. Thus the crystal directions are more effectively controlled. Further, a mold may have pouring basin 7 at the tip of opening 6d as shown in FIG. 5d. The bottom of pouring basin 7 is in contact with cooling plate 5. As there is a temperature gradient between the bottom and the top of pouring basin 7, crystals of a certain size in the uniform crystal direction are formed, the crystal direction is further selected by the opening 6d. As a result, a magnetostrictive material is formed having a well controlled crystal direction.

Further, when a mold described above is used, ingots cast in the more uniform crystal direction can be obtained by providing a solid crystal oriented in the desired crystalline direction at the colder end of the mold.

Also, a cooling plate can be provided at the core of a columnar mold with the circumference of the mold sides heated. Using such an arrangement a radially oriented temperature gradient would extend from the central core to the sides of the heated mold. When a magnetostrictive material is cast using such a mold the material solidifies on the central core and grows in a uniform direction toward the sides of the mold. When solidified in such a manner the crystalline material is radially anisotropic.

Alumina, BN, MgO, CaO, carbon, etc. can be used as material for the mold described above. Further, it is desirable to smooth the surface of a mold. If the inner surface of a mold is excessively rough, that part becomes the nucleus for growing crystals.

As the cooling plate material, metals having relatively large thermal conductivity such as copper or iron are usable. As necessary, the cooling plate may be water cooled.

To suppress reaction between melted alloy and the mold, and to make it easy to separate the mold and magnetostrictive material after it is cooled, a separating agent such as BN on the inner surface of the mold can be applied as necessary.

When heating the side of the mold, if all the sides are at the same temperature, the heating temperature is desirable to be above the eutectic temperature of the magnetostrictive material being cast. This is because crystals begin to grow from the side of the mold below the eutectic temperature and it becomes difficult to make the crystal directions uniform. Further, if heating temperature is too high, a reaction may take place between the mold and magnetostrictive material. The desirable temperature is within a range from the eutectic temperature of the magnetostrictive material being cast to a temperature that is 100° C. above the melting point of the magnetostrictive material being cast.

Figure 6:
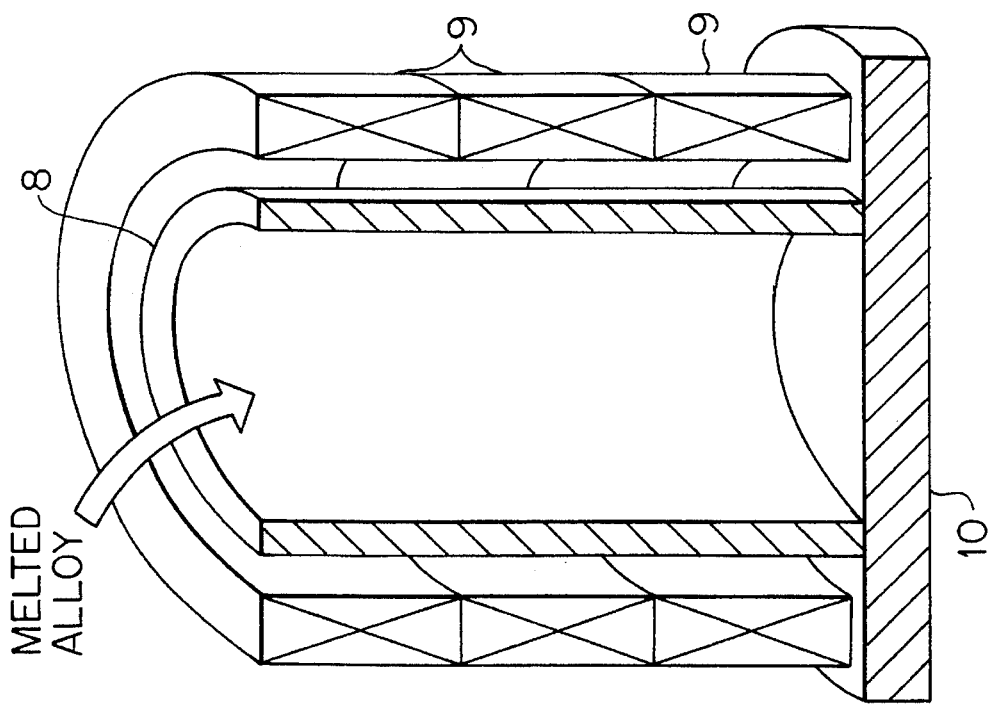
FIGS. 4 to 7, are cross-sectional views of the molds used in the examples of the second embodiment of the invention.

When heating the sides of the mold, the heater may be controlled by dividing it into two or more parts to heat the mold with a temperature gradient provided between the upper and lower parts of the mold. In this case, if the temperature gradient is provided to heat the mold in such a manner that the lower part of the mold is heated to a low temperature while the upper part is heated to a high temperature, the crystals directions of the magnetostrictive material being cast are made more uniform than when the mold was heated with the side temperature kept at a constant level. An example of a mold provided with side heating heaters split into several units is shown in FIG. 6. In the example shown in FIG. 6, it is possible to split heater 3 for heating the side of mold 8 into three units and provide temperature gradients to 3 stages of the upper part, middle part and lower part at the side. Further, a cooling plate 10 is provided at the bottom of mold 8.

In case of a rare earth-iron Laves type intermetallic compound, a desirable heating temperatures is in a range from 600° C. to 900° C. at the lower part of a mold and a range from 850° C. to 1300° C. at the upper part. An insulator may be installed between such a heater and a mold for the purpose of controlling a temperature gradient.

After casting, it is desirable to gradually cool the magnetostrictive alloys for making the crystal directions more uniform.

When turning the heater off, if a temperature gradient was provided between the upper and lower parts of a mold, there are three methods available: (1) turn off all of multiple heater units at one time, (2) gradually lower the temperature of the entire mold, and (3) turn off the heaters from the lower temperature part to the higher temperature part. All of these three methods are effective but a desirable method is to turn the heaters off starting from the low temperature to the higher temperatures.

It is desirable to perform the dissolution and casting of magnetostrictive materials in an atmosphere of inert gas such as argon, helium or in a vacuum.

Further, cast ingots may be heat treated for 0.1 to 500 hours at temperatures in a range from 850° C. to 1200° C. This heat treatment can reduce magnetic impurity phases, homogenize the alloy and reduce the coercive force of magnetostrictive alloys so treated.

The magnetostrictive alloys of the present invention are further improved by a plastic deformation process. Since magnetostrictive alloys are normally used in the shapes of wire, rod, etc., the magnetostrictive alloy obtained according to the methods described above dan be made into desired shapes without a grinding process. Therefore, the productivity of such processes is high. In addition, since its structure can be made uniform along the direction of plastic deformation, it is possible to make the crystal direction uniform and promote the magnetostrictive characteristic in the formed materials.

In such a preferred method the materials mixed in the prescribed amounts are blended and then dissolved using an ordinary dissolving method such as high frequency induction dissolution, etc., to produce an ingot of rare earth-iron system magnetostrictive alloy. At this time, it is preferred to make the crystal directions uniform in the casting using the methods disclosed above or prior art methods such as the Bridgman method, etc.

Then, the casting is plastically deformed through hot working and a magnetostrictive alloy is obtained. The hot working method may be an extrusion process, drawing, rolling, or the like. Further, the temperature during the plastic deformation must be above 500° C. and below the melting point of the ingot. This is because a sufficient plastic deformation cannot be obtained below 500° C. and the shape of alloy cannot be maintained at above the melting point of the alloy ingot. The desirable temperature range is from 800° C. to 1200° C., more practically from 1000° C. to 1200° C. Further, wire shaped rods as thin as below 1 mm$\phi$ can be formed by performing such hot working repeatedly. In addition, it is also possible to promote the magnetostrictive characteristic by performing the heat treatment for 0.1 to 500 hours at 500° to 1100° C. after the hot working. It is desirable to perform the hot working and heat treatment in an atmosphere of inert gas such as argon gas, helium gas or in a vacuum.

When forming the ingot, it is desirable to cast the materials covered with a metal and to hot work the cast ingot when it is within such a metal cover.

A magnetostrictive alloy having excellent mechanical strength and corrosion resistance can be produced by covering the magnetostrictive alloy with a metal during hot working. The covering metal should have a melting temperature higher than the hot working temperature and a sufficient deformation ability at the hot working temperature. The metal is preferably selected from the group consisting of: stainless steel, Cu or Cu alloys, Ni or Ni alloys, Ti or Ti alloys.

EXAMPLES 1–17, COMPARATIVE EXAMPLES 1–4

The test pieces (10 mm×10 mm×5 mm) were prepared for the examples 1–17 of the magnetostriction alloy of the first embodiment of the present invention and the magnetostriction alloys as the comparison examples 1–5 were prepared from conventional rare earth-iron systems as shown in Table 1. The alloy ingots were produced by the arc melting method in a water-cooled copper mold covered with argon gas and homogenized to form examples 1–7, 15–17 and the comparison examples 1–5 shown in Table 1. The unidirectionally solidified bodies were obtained by the unidirectional solidification method for the example 8–11 and the multi-crystal powders were sintered in a magnetic field to get sintered bodies and furthermore, homogenized for one week at 900° C. for the example 12–14. Then, the test pieces in the dimensions described above were obtained by cutting these alloy ingots, unidirectionally solidified bodies and sintered bodies.

With the 2 kOe low magnetic field applied by opposite magnetic pole-type electromagnets at room temperature, the values of magnetostriction (magnetostrictive characteristic) of these test prices were measured with a strain gauge. The measured values were standardized according to the volume of magnetostriction of $DyFe_2$ and also shown in Table 1.

TABLE 1

(Examples)

| | Composition (Atomic %) | Manufacturing method | Magnetostrictive characteristic (ratio to $DyFe_2$) |
|---|---|---|---|
| 1 | $Tb_{0.3}La_{0.2}Dy_{0.5}(Fe_{0.9}Mn_{0.1})_2$ | I | 12 |
| 2 | $Tb_{0.4}Ce_{0.3}Dy_{0.3}(Fe_{0.8}Mn_{0.2})_2$ | I | 10 |
| 3 | $Tb_{0.2}Pr_{0.2}Dy_{0.6}(Fe_{0.9}Mn_{0.1})_2$ | I | 10 |
| 4 | $Tb_{0.2}Y_{0.4}Dy_{0.4}(Fe_{0.8}Mn_{0.2})_2$ | I | 9 |
| 5 | $Tb_{0.1}Nd_{0.3}Dy_{0.6}(Fe_{0.8}Mn_{0.2})$ | I | 8 |
| 6 | $Tb_{0.3}Sm_{0.1}Dy_{0.5}(Fe_{0.8}Co_{0.1}Mn_{0.1})_2$ | I | 10 |
| 7 | $Tb_{0.2}Pr_{0.2}Dy_{0.6}(Fe_{0.85}Mn_{0.1}Al_{0.05})_2$ | I | 12 |
| 8 | $Tb_{0.2}Pr_{0.2}Dy_{0.6}(Fe_{0.9}Mn_{0.1})_2$ | II | 18 |
| 9 | $Tb_{0.4}Pr_{0.1}Dy_{0.5}(Fe_{0.8}Mn_{0.2})_2$ | II | 18 |
| 10 | $Tb_{0.1}Nd_{0.3}Dy_{0.6}(Fe_{0.8}Mn_{0.2})_2$ | II | 16 |
| 11 | $Tb_{0.2}Pr_{0.2}Dy_{0.6}(Fe_{0.85}Mn_{0.1}Al_{0.05})_2$ | II | 18 |
| 12 | $Tb_{0.2}Pr_{0.4}Dy_{0.4}(Fe_{0.8}Mn_{0.2})_2$ | III | 9 |
| 13 | $Tb_{0.2}Nd_{0.3}Dy_{0.5}(Fe_{0.5}Co_{0.4}Mn_{0.1})_2$ | III | 10 |
| 14 | $Tb_{0.2}Pr_{0.2}Dy_{0.6}(Fe_{0.85}Mn_{0.1}Al_{0.05})_2$ | III | 10 |
| 15 | $Tb_{0.1}Sm_{0.8}Dy_{0.1}(Fe_{0.9}Mn_{0.1})_{1.9}$ | I | −10 |
| 16 | $Tb_{0.3}Ce_{0.6}Dy_{0.1}(Fe_{0.8}Mn_{0.2})_{1.9}$ | I | 7 |
| 17 | $Tb_{0.3}La_{0.6}Dy_{0.1}(Fe_{0.8}Mn_{0.2})_{1.9}$ | I | 7 |

(Comparative Examples)

| | Composition | Manufacturing method | Magnetostrictive characteristic (ratio to $DyFe_2$) |
|---|---|---|---|
| 1 | $DyFe_2$ | I | 1 |
| 2 | $Pr_{0.95}Dy_{0.05}(Fe_{0.9}Mn_{0.1})_2$ | I | 2 |
| 3 | $Tb_{0.3}Nd_{0.1}Dy_{0.6}(Fe_{0.4}Mn_{0.6})_2$ | I | 5 |
| 4 | $Tb_{0.3}Ce_{0.1}Dy_{0.6}(Fe_{0.9}Mn_{0.1})_{1.3}$ | I | 3 |

TABLE 1-continued

| | | |
|---|---|---|
| 5 $Tb_{0.2}La_{0.1}Dy_{0.7}(Fe_{0.8}Mn_{0.2})_{2.7}$ | I | 4 |

Manufacturing method as follows:
I: arc melting method
II: unidirectional solidification method
III: sintering method As clearly seen from Table 1, all of the magnetostrictive alloys of the invention have exceptionally high magnetostrictive characteristics (the values of the standardized magnetostrictive characteristics are 8–18) in the low magnetic field than conventional rare earth-iron system magnetostrictive alloys (the values of the standardized magnetostrictive characteristics are 1–5). Among the magnetostrictive alloys in these examples, the test pieces from the unidirectionally solidified bodies (examples 8–11) show exceptionally high magnetostrictive characteristics.

EXAMPLES 18–31, COMPARATIVE EXAMPLES 6–9

The unidirectionally solidified bodies arranged in the <110> or <111> direction in cubic system were obtained for the test pieces of the examples 8–31 relative to the second embodiment of the present invention. Magnetostrictive alloys having random crystal structure were obtained for the comparative examples 6–9.

Then they were cut in the dimension 10×10×5 mm as the test pieces. They are shown in Table 2.

With the 2 kOe low magnetic field applied in the direction of the easy magnetization axis except example 29–31 by opposite magnetic pole-type electromagnets at room temperature, the values of magnetostriction (magnetostrictive characteristic) of these test pieces were measured with a strain gauge. The measured values were standardized according to the value of magnetostriction of $DyFe_2$.

TABLE 2

| | Composition | Magnetostrictive Characteristic (Ratio to $DyFe_2$) | Axis of Easy Magnetization | Direction Orientation | Value of Px** |
|---|---|---|---|---|---|
| examples | | | | | |
| 18 | $SmFe_2$ | −16 | <110> | <110> | 5.6 |
| 19 | $Sm_{0.8}Dy_{0.2}Fe_{1.9}$ | −15 | <110> | <110> | 6.0 |
| 20 | $Sm(Fe_{0.9}Co_{0.1})_2$ | −17 | <110> | <110> | 6.2 |
| 21 | $Sm(Fe_{0.9}Ni_{0.1})_2$ | −14 | <110> | <110> | 5.8 |
| 22 | $Sm(Fe_{0.9}Mn_{0.1})_{1.9}$ | −17 | <110> | <110> | 6.4 |
| 23 | $Tb_{0.3}Dy_{0.7}Fe_2$ | 19 | <111> | <111> | 10.0 |
| 24 | $Tb_{0.3}Dy_{0.7}Fe_{0.9}Co_{0.1})_{1.9}$ | 19 | <111> | <111> | 9.5 |
| 25 | $Tb_{0.3}Dy_{0.7}(Fe_{.09}Ni_{0.1})_2$ | 17 | <111> | <111> | 10.5 |
| 26 | $Tb_{0.5}Dy_{0.5}(Fe_{0.9}Mn_{0.1})_2$ | 22 | <111> | <111> | 12.0 |
| 27 | $Tb_{0.4}Dy_{0.6}(Fe_{0.8}Mn_{0.2})_2$ | 20 | <111> | <111> | 10.8 |
| 28 | $Tb_{0.2}Dy_{0.6}Pr_{0.2}(Fe_{0.8}Mn_{0.2})_2$ | 18 | <110> | <110> | 8.6 |

TABLE 2-continued

|  | Composition | Magnetostrictive Characteristic (Ratio to $DyFe_2$) | Axis of Easy Magnetization | Direction Orientation | Value of Px** |
|---|---|---|---|---|---|
| 29* | $Tb_{0.3}Dy_{0.7}Fe_2$ | 18 | <111> | <110> | 10.3 |
| 30* | $Tb_{0.3}Dy_{0.7}(Fe_{0.9}Co_{0.1})_2$ | 18 | <111> | <110> | 10.1 |
| 31* | $Tb_{0.5}Dy_{0.5}(Fe_{0.9}Mn_{0.1})_2$ | 20 | <111> | <110> | 10.2 |
| Comparative examples | | | | | |
| 6 | $Tb_{0.3}Dy_{0.7}Fe_2$ | 8 | — | random | 0.65 |
| 7 | $Tb_{0.5}Dy_{0.5}Fe_{1.9}$ | 6 | — | random | 0.60 |
| 8 | $Tb_{0.5}Dy_{0.5}(Fe_{0.9}Mn_{0.1})_2$ | 8 | — | random | 0.60 |
| 9 | $DyFe_2$ | 1 | — | random | 0.75 |

*The magnetic field was applied in the direction of orientation
**Px = $I_{220}/I_{311}$ $I_{220}$, $I_{311}$ mentioned before As clearly seen from table 2, all of the magnetostrictive alloys of the invention show exceptionally higher magnetostrictive characteristics (the values of the standardized magnetostrictive characteristics are 17–22 and −14—17) than conventional rare earth-iron magnetostrictive alloys (the values of the standardized magnetostrictive characteristics are 1–8).

Figure 7:
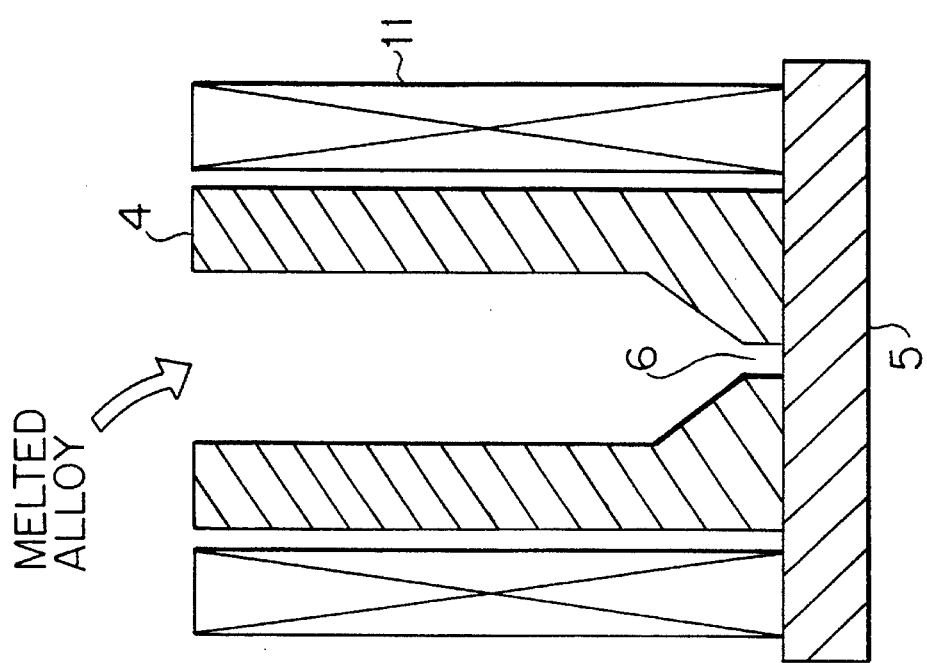

FIG. 7 shows the crystal direction of the magnetostrictive alloy in the above example 28 observed through X-ray diffraction. It can be seen that the magnetostrictive alloy of example 28 with a large magnetic field magnetostrictive characteristic is oriented in the <110> direction, observed as the <220> and <440> directions which are even number multiples of <110>.

EXAMPLES 32–36, COMPARATIVE EXAMPLES 10–14

The alloy ingots were obtained by the arc melting method for the test pieces of examples 32–36 relative to the third embodiment of the present invention. The alloy ingots were also obtained by the arc melting method for the test pieces of comparative example 10–14. They were cut in the dimensions 10×10×5 mm to form the test pieces. They are shown in Table 3.

With the 2 kOe low magnetic field applied in the direction of orientation by opposite magnetic pole-type electromagnets at room temperature, the values of magnetostriction (magnetostrictive characteristic) of these test pieces were measured with a strain gauge. The measured values were standardized according to the value of magentostriction of $DyFe_2$ and also shown in Table 3.

TABLE 3

|  | Composition | Magnetostrictive-Characteristics (ratio to $DyFe_2$) | Content of 1–3 phase |
|---|---|---|---|
| example | | | |
| 32 | $Tb_{0.5}Dy_{0.5}(Fe_{0.8}Mn_{0.2}Al_{0.1})_{2.00}$ | 18 | 0 |
| 33 | $Tb_{0.4}Dy_{0.6}(Fe_{0.7}Mn_{0.2}Ga_{0.1})_{1.95}$ | 10 | 0 |
| 34 | $Tb_{0.3}Dy_{0.7}(Fe_{0.8}Mn_{0.15}Al_{0.05})_{2.05}$ | 15 | 0 |
| 35 | $Tb_{0.2}Dy_{0.8}(Fe_{0.6}Co_{0.2}Mn_{0.15}Ga_{0.05})_{1.90}$ | 10 | Δ |
| 36 | $Tb_{0.5}Dy_{0.5}(Fe_{0.9}Mn_{0.05}Al_{0.05})_{2.10}$ | 16 | Δ |
| comparative examples | | | |
| 10 | $Tb_{0.3}Dy_{0.7}Fe_{1.95}$ | 7 | Δ |
| 11 | $Tb_{0.5}Dy_{0.5}(Fe_{0.9}Al_{0.1})_{2.00}$ | 6 | X |
| 12 | $Tb_{0.5}Dy_{0.5}(Fe_{0.8}Mn_{0.1}Ga_{0.1})_{2.20}$ | 8 | X |
| 13 | $Tb_{0.3}Dy_{0.7}(Fe_{0.7}Mn_{0.3}Al_{0.1})_{1.85}$ | 5 | X |
| 14 | $DyFe2$ | 1 | X |

0: nearly equal 0 vol %, Δ: 1–5 vol %, X: more than 5 vol %

As clearly seen from Table 3, all of the magnetostrictive alloys of the invention show exceptionally higher magnetostrictive characteristics (the value of the standardized magnetostrictive characteristics are 10–18) than conventional rare earth-iron system magnetostrictive alloys (the values of the standardized magnetostrictive characteristics are 10–18) in the low magnetic field.

The test pieces of these examples 32–36 have 5 vol % or less contents of 1–3 phase. On the other hand, the pieces of comparative examples have more than 5 vol % of 1–3 phase. They are shown in table by signs of 0, Δ and X.

In the case of the examples 32–36, the homogenizing process to reduce the content of 1–3 phase is unnecessary and such a material can be used immediately after being manufactured.

Figure 2:
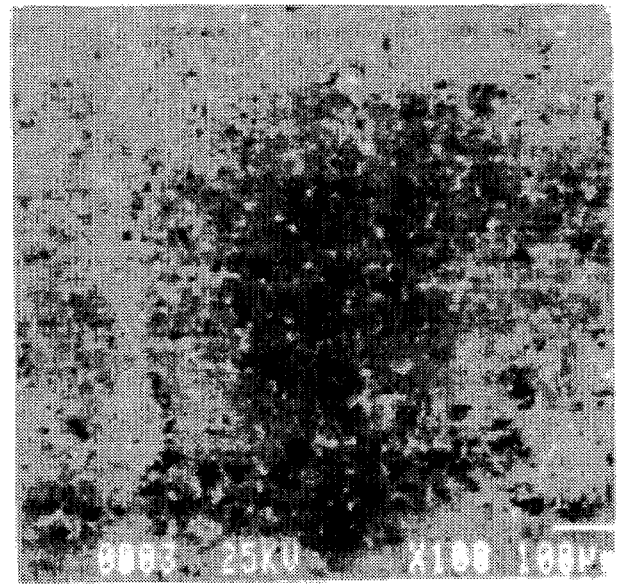
FIG. 2 is a photomicrograph showing the structure of the magnetostrictive alloy of example 32 including the present invention.
Figure 3:
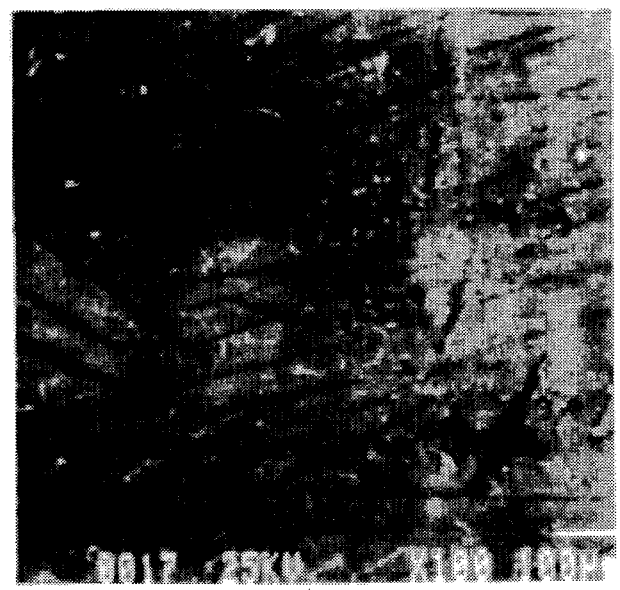
FIG. 3 is a photomicrograph showing the structure of the magnetostrictive alloy of the comparative example 11.

FIGS. 2 and 3 are photomicrographs, taken by SEM (voltage: 25 kv), showing the metal structures of the magnetostrictive alloys of example 32 and comparative example 11, respectively. It can be confirmed that the needle shaped 1-3 phases are much more frequently observed in FIG. 3, showing the structure of comparative example 11. The needle shaped 1-3 phase, however, can not be seen in FIG. 2 showing the structure of example 32.

EXAMPLE 37

A melted alloy of $Tb_{0.4}$ $Dy_{0.6}$ $(Fe_{0.9}$ $Mn_{0.1})_{1.93}$ was obtained using high frequency induction dissolution in an argon atmosphere with the alloy in an alumina crucible. The above-mentioned alloy was cast in a mold heated at its side and an alloy ingot was obtained. The cross-sectional view showing the shape of the mold used in this example is shown in FIG. 4. Heating the side of mold 1 by heater 2 positioned around the side and cooling the bottom surface of the mold by cooling plate 3, a temperature gradient was provided between the top and the bottom of mold 1.

Using an alumina mold having an inner diameter 40 mm for mold 1 and carbon heaters for heaters 2, and the side of mold 1 was heated to 950° C. In addition, a water cooled copper plate 3 was provided and was the starting point of the crystal growth. After casting, the magnetostrictive ingot was furnace cooled.

The magnetostrictive ingot was machined to a 8 mm cube and its magnetostrictive characteristic in the axial direction of the mold was evaluated at room temperature using a strain gauge. The magnetic field was produced with a dipole magnet and magnetostriction striction ($\lambda$) in the 2 kOe magnetic field was measured. The result was 800 ppm.

COMPARISON EXAMPLE 15

A magnetostrictive alloy was obtained by casting melted alloy with a mold similar to example 37 under the same conditions without heating the side of the mold. Its magnetostriction was measured like example 37 but a value of 400 ppm was obtained.

From example 37 and Comparison Example 15, it is seen that the magnetostrictive characteristic has been improved when the material is cast with a temperature gradient provided between the bottom and the top of the mold.

EXAMPLES 38 TO 49

As shown in Table 4, the alloys of examples 38 to 49 were obtained and measured as similar method as example 37. The heating temperatures, cooling speeds after casting and measured values ($\lambda$) in same condition (2 kOe) of example 37 are also shown in Table 4.

As clearly seen from the results shown in Table 4, magnetostrictive characteristics of all the cast magnetostrictive alloys made by the preferred method were satisfactory.

EXAMPLE 50

A melted alloy of $Tb_{0.35}$ $Dy_{0.65}$ $(Fe_{0.9}$ $Mn_{0.1})_{1.95}$ was obtained by high frequency induction dissolution in an argon atmosphere using an alumina crucible. The alloy was melted and cast to form ingot using the mold shown in cross section in FIG. 6. Three split heaters 9 on mold 8 provided three stages of temperature gradient to its side. In addition, cooling plate 10 was installed at the bottom of the mold. Using an alumina mold having an inner diameter of 40 mm and carbon heaters for heaters 9, the lower part, middle part and upper part of the mold were heated to 800° C., 950° C. and 1100° C., respectively. After casting, each of the ingots was cooled at the rate of 5° C./min.

The magnetostrictive ingot was machined to a cube having 8 mm sides. An axial magnetostrictive characteristic at room temperature was measured using a strain gauge. The magnetic field was produced using a dipole magnet and magnetostriction ($\lambda$) in the 2 kOe magnetic field was measured. The result was 880 ppm.

COMPARATIVE EXAMPLE 16

Casting the melted alloy obtained in a manner similar to example 50 using a mold similar to that used in example 50 under the same conditions without heating the side of the mold, magnetostriction of the alloy was measured like example 50, but a value of 420 ppm was obtained.

EXAMPLES 51 TO 62

As shown in Table 5, the alloys of example 51 to 62 were obtained and measured using a similar method as example 50. The heating temperatures, cooling after casting and measured values ($\lambda$) in same condition (2 kOe) of example 39 are also shown in Table 5.

TABLE 4

| examples | Composition | Heating Temperature (°C.) | Cooling Speed (°C./Min) | $\lambda$ (2 kOe) |
| --- | --- | --- | --- | --- |
| 38 | $Tb_{0.5}Dy_{0.5}(Fe_{0.9}Mn_{0.1})_{1.95}$ | 850 | * | 850 ppm |
| 39 | $Tb_{0.4}Dy_{0.6}(Fe_{0.8}Co_{0.1}Zn_{0.1})_{1.92}$ | 950 | 2 | 900 ppm |
| 40 | $Tb_{0.3}Dy_{0.7}(Fe_{0.9}Mg_{0.05}Al_{0.05})_{1.9}$ | 1000 | 10 | 930 ppm |
| 41 | $Tb_{0.3}Dy_{0.7}(Fe_{0.9}Ga_{0.05}V_{0.05})_{1.9}$ | 900 | 5 | 790 ppm |
| 42 | $Tb_{0.3}Dy_{0.7}(Fe_{0.9}Mn_{0.05}Zr_{0.05})_{1.94}$ | 1050 | 20 | 830 ppm |
| 43 | $Tb_{0.4}Dy_{0.6}(Fe_{0.9}Hf_{0.05}Ti_{0.05})_{1.97}$ | 1000 | 30 | 950 ppm |
| 44 | $Tb_{0.4}Dy_{0.5}Pr_{0.1}(Fe_{0.9}Nb_{0.05}Si_{0.05})_{1.95}$ | 900 | 8 | 880 ppm |
| 45 | $Tb_{0.4}Dy_{0.5}Ho_{0.1}(Fe_{0.9}Mo_{0.05}Cu_{0.05})_{1.95}$ | 950 | 10 | 910 ppm |
| 46 | $Tb_{0.4}Dy_{0.6}(Fe_{0.8}Mn_{0.15}B_{0.05})_{2.1}$ | 870 | 5 | 920 ppm |
| 47 | $Tb_{0.3}Dy_{0.7}(Fe_{0.9}Ni_{0.05}Sn_{0.05})_{1.93}$ | 930 | 10 | 900 ppm |
| 48 | $Sm_{0.7}Er_{0.3}(Fe_{0.9}Co_{0.05}Ag_{0.05})_{1.9}$ | 1050 | * | −780 ppm |
| 49 | $Sm_{0.7}Yb_{0.3}(Fe_{0.9}Co_{0.05}Mn_{0.05})_{1.95}$ | 1100 | 10 | −850 ppm |

*Furnace cooled

TABLE 5

| Composition | Heating Temperature (°C) | | | $\lambda$ (2 kOe) |
| --- | --- | --- | --- | --- |
| | Lower Part | Middle Part | Upper Part | |
| 51 $Tb_{0.4}Dy_{0.6}(Fe_{0.9}Mn_{0.1})_{1.95}$ | 650 | 900 | 1200 | 900 ppm |
| 52 $Tb_{0.5}Dy_{0.5}(Fe_{0.8}Co_{0.1}Zn_{0.1})_{1.93}$ | 700 | 850 | 1100 | 930 ppm |
| 53 $Tb_{0.3}Dy_{0.7}(Fe_{0.9}Mg_{0.05}Al_{0.05})_{1.91}$ | 800 | 950 | 1150 | 910 ppm |
| 54 $Tb_{0.4}Dy_{0.6}(Fe_{0.9}Ga_{0.05}V_{0.05})_{1.92}$ | 850 | 1000 | 1200 | 890 ppm |
| 55 $Tb_{0.35}Dy_{0.65}(Fe_{0.9}Mn_{0.05}Zr_{0.05})_{1.94}$ | 900 | 1050 | 1300 | 950 ppm |
| 56 $Tb_{0.3}Dy_{0.7}(Fe_{0.9}Hf_{0.05}Ti_{0.05})_{1.96}$ | 880 | 980 | 1100 | 890 ppm |
| 57 $Tb_{0.3}Dy_{0.5}Pr_{0.2}(Fe_{0.9}Nb_{0.05}Si_{0.05})_{1.95}$ | 800 | 1000 | 1200 | 920 ppm |
| 58 $Tb_{0.4}Dy_{0.4}Ho_{0.2}(Fe_{0.9}Mo_{0.05}Cu_{0.05})_{1.93}$ | 900 | 1050 | 1300 | 960 ppm |
| 59 $Tb_{0.5}Dy_{0.5}(Fe_{0.8}Mn_{0.15}B_{0.05})_{21}$ | 870 | 1000 | 1200 | 920 ppm |
| 60 $Tb_{0.3}Dy_{0.7}(Fe_{0.8}Ni_{0.15}Sn_{0.05})_{1.95}$ | 800 | 950 | 1200 | 910 ppm |
| 61 $Sm_{0.8}Er_{0.2}(Fe_{0.9}Co_{0.05}Ag_{0.05})_{1.93}$ | 850 | 1000 | 1150 | −860 ppm |
| 62 $Sm_{0.7}Yb_{0.3}(Fe_{0.9}Co_{0.07}Mn_{0.03})_{1.95}$ | 700 | 1000 | 1300 | −880 ppm |

EXAMPLE 63

A melted alloy of $Tb_{0.45}Dy_{0.55}(Fe_{0.9}Mn_{0.1})_{1.96}$ was obtained using high frequency induction dissolution in an argon atmosphere using an alumina crucible.

The cross-sectional view of the mold used in this example is shown in FIG. 7. Mold 4 is provided with a narrow opening 6 at the bottom, adjacent cooling plate 5 and heaters 11 along the sides. The alumina mold 4 has an inner diameter of 60 mm. Heaters 11 were carbon heaters which heated the side of mold 4 to 1000° C. After casting, the magnetostrictive ingot was cooled at the rate 5° C./min.

The magnetostrictive ingot was machined to a 8 mm cube and its axial magnetostrictive characteristic was evaluated at room temperature using a strain gauge. The magnetic field was produced by a dipole magnet and the magnetostriction ($\lambda$) in the 2 kOe magnetic field was measured. The result was 950 ppm.

COMPARATIVE EXAMPLE 17

Figure 8:
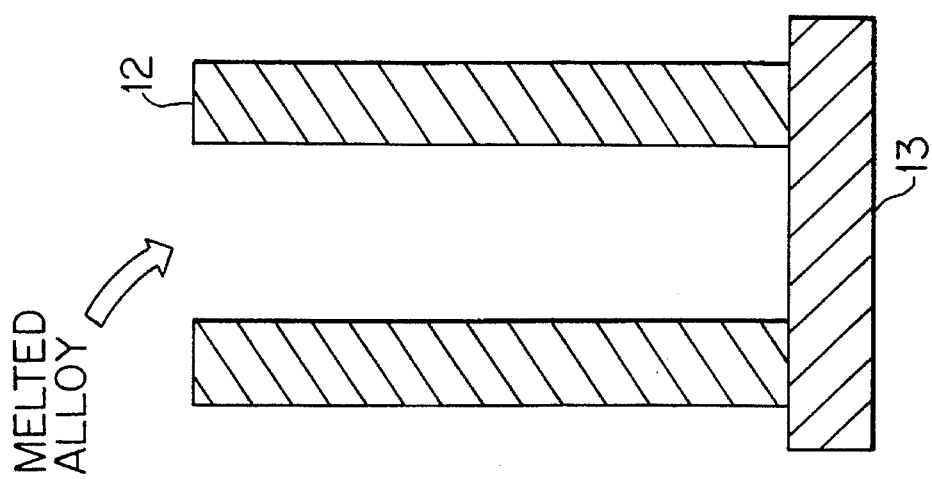
FIG. 8 is a cross-sectional view of the mold used in the comparative example 17.

Casting the melted alloy of the same composition as in example 50 with a mold without the cooling end provided, an alloy ingot was obtained. The cross-sectional view of the mold used in this example is shown in FIG. 8. Mold 12 has cooling plate 13 at its bottom. Further, the side of the mold was not heated but all other conditions were the same as example 50. The magnetostriction of the alloy was measured, and a value of 450 ppm was obtained.

EXAMPLE 64 TO 75

As shown in Table 6, the alloys of example 64 to 75 were obtained and measured as similar method as example 63. The heating temperature, cooling after casting and measured values ($\lambda$) in same condition (2 kOe) of example 50 are also shown in Table 6. In these examples the mold was heated by 3 split carbon heaters similar to that shown in FIG. 7.

TABLE 6

| Composition | Heating Temperature (°C) | | | $\lambda$ (2 kOe) |
| --- | --- | --- | --- | --- |
| | Lower Part | Middle Part | Upper Part | |
| 64 $Tb_{0.3}Dy_{0.7}(Fe_{0.9}Mn_{0.1})_{1.92}$ | 850 | 1000 | 1200 | 920 ppm |
| 65 $Tb_{0.4}Dy_{0.4}(Fe_{0.7}Co_{0.2}Zn_{0.1})_{1.96}$ | 800 | 950 | 1200 | 900 ppm |
| 66 $Tb_{0.5}Dy_{0.5}(Fe_{0.9}Mg_{0.03}Al_{0.07})_{1.94}$ | 780 | 950 | 1150 | 930 ppm |
| 67 $Tb_{0.3}Dy_{0.7}(Fe_{0.9}Ga_{0.08}V_{0.02})_{1.91}$ | 750 | 950 | 1150 | 880 ppm |
| 68 $Tb_{0.45}Dy_{0.55}(Fe_{0.9}Mn_{0.09}Zr_{0.01})_{1.97}$ | 900 | 1100 | 1300 | 980 ppm |
| 69 $Tb_{0.55}Dy_{0.45}(Fe_{0.9}Hf_{0.05}Ti_{0.05})_{1.93}$ | 860 | 980 | 1120 | 940 ppm |
| 70 $Tb_{0.2}Dy_{0.6}(Pr_{0.2}(Fe_{0.9}Nb_{0.05}Si_{0.05})_{1.91}$ | 900 | 1050 | 1200 | 860 ppm |
| 71 $Tb_{0.3}Dy_{0.5}Ho_{0.2}(Fe_{0.9}Mo_{0.02}Cu_{0.08})_{1.95}$ | 900 | 1050 | 1300 | 930 ppm |
| 72 $Tb_{0.6}Dy_{0.4}(Fe_{0.8}Mn_{0.15}B_{0.05})_{2.05}$ | 850 | 1000 | 1150 | 900 ppm |
| 73 $Tb_{0.35}Dy_{0.65}(Fe_{0.9}Ni_{0.05}Sn_{0.05})_{1.93}$ | 830 | 980 | 1200 | 950 ppm |
| 74 $Sm_{0.8}Er_{0.2}(Fe_{0.8}Co_{0.15}Ag_{0.05})_{1.92}$ | 850 | 1050 | 1250 | −830 ppm |
| 75 $Sm_{0.7}Yb_{0.3}(Fe_{0.9}Co_{0.07}Mn_{0.03})_{1.95}$ | 650 | 1050 | 1300 | −910 ppm |

EXAMPLE 76

A melted alloy of $Tb_{0.4}Dy_{0.6}(Fe_{0.9}Mn_{0.1})_{1.93}$ was obtained by high frequency induction dissolution in an argon atmosphere using a BN crucible. The melted alloy was cast in a 30 mm diameter mold heated to 1100° C. by a carbon heater, and cooled in a furnace. The ingot of example 76 was obtained. A water cooled copper plate was provided to start the crystal growth.

Figure 9:
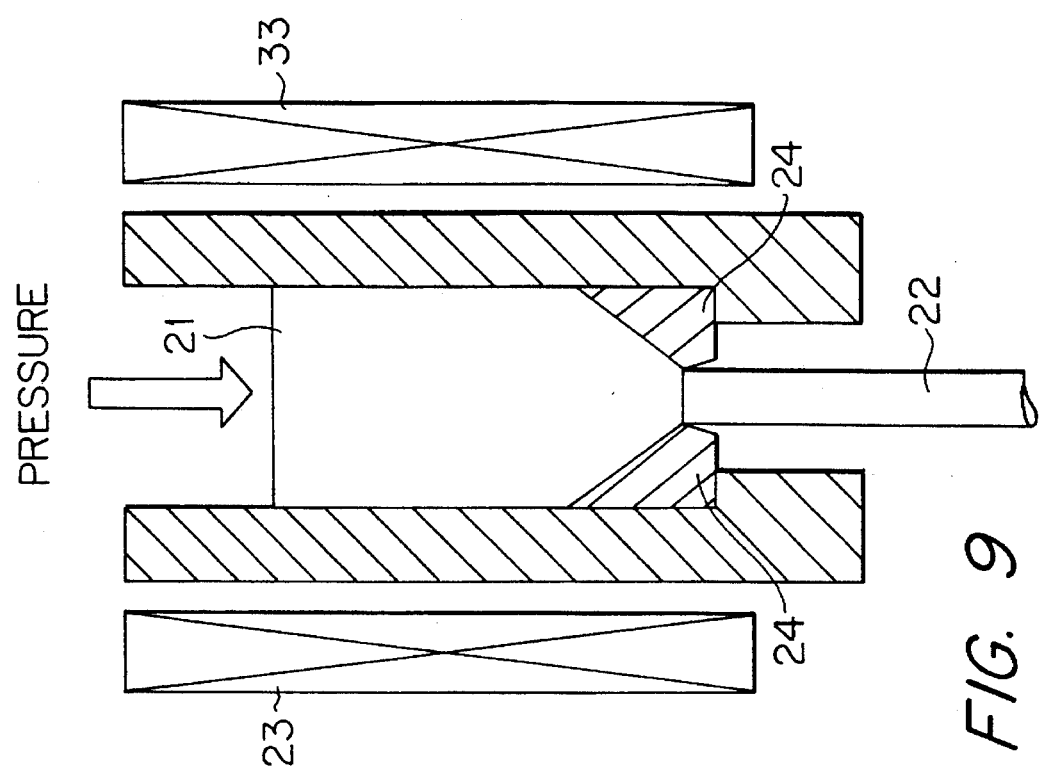

The alloy ingot was processed according to the hot extrusion method at a temperature 1050° C. and extruding pressure 4 ton/cm². A magnetostrictive alloy rod 8 mm in diameter was obtained. The hot extrusion apparatus is shown in FIG. 9. The ingot 21 was pressed and formed into a rod 22 at the noted temperature provided by heaters 23 and formed into the rod by dies 24.

The magnetostrictive alloy rod was machined to a 6 mm cube and its magnetostrictive characteristic in the extruded direction and the right angle direction were evaluated at room temperature using a strain gauge. The magnetic field was produced with a dipole magnet and magnetostriction ($\lambda$) in the 2 kOe magnetic field was measured. The results of a value of 1000 ppm in the extruding direction and a value of 400 ppm in the right angle direction were measured. An anisotropic alloy rod was obtained according to the invention.

REFERENCE 7

A magnetostrictive alloy rod having the same composition produced according to a grinding process without performing the hot extrusion process was also evaluated. The magnetostrictive characteristic of this rod was a value of 800 ppm in the extrusion direction and 700 ppm in the right angle direction, and the anisotropy was small.

EXAMPLE 77 TO 83

Furthermore, the magnetostrictive characteristics of the magnetostriction alloy rods produced by varying the composition and processing conditions according to the invention are shown in Table 7.

TABLE 7

| examples | Composition | Working Temperature | Extension Pressure | Rod Diameter | Heat-treading Conditions | | λ (2 kOe) in the extruding Axial Direction |
|---|---|---|---|---|---|---|---|
| | | | | | Temperature | Time | |
| 77 | $Tb_{0.3}Dy_{0.7}(Fe_{0.85}Mn_{0.1}Al_{0.05})_{1.90}$ | 950° C. | 5 ton/cm$^2$ | 10 mm | 900° C. | 2 hr | 980 ppm |
| 78 | $Tb_{0.5}Dy_{0.5}(Fe_{0.9}Nn_{0.1})_{1.95}$ | 1180° C. | 2 ton/cm$^2$ | 8 mm | 950° C. | 3 hr | 1130 ppm |
| 79 | $Tb_{0.3}Dy_{0.6}Pr_{0.1}(Fe_{0.9}Co_{0.1})_{1.96}$ | 1100° C. | 3 ton/cm$^2$ | 6 mm | 1000° C. | 1 hr | 950 ppm |
| 80 | $Tb_{0.35}Dy_{0.65}(Fe_{0.9}Ga_{0.05}Zn0.05)_{1.85}$ | 850° C. | 6 ton/cm$^2$ | 12 mm | 950° C. | 5 hr | 900 ppm |
| 81 | $Tb_{0.3}Dy_{0.6}HO_{0.1}(Fe_{0.9}Zr_{0.05}Si_{0.05})_{1.92}$ | 1000° C. | 4 ton/cm$^2$ | 4 mm | 1000° C. | 2 hr | 1050 ppm |
| 82 | $Sm_{0.8}Yb_{0.2}Fe_{1.90}$ | 1120° C. | 3 ton/cm$^2$ | 6 mm | 950° C. | 5 hr | −980 ppm |
| 83 | $Sm_{0.8}Er_{0.1}Y_{0.1}(Fe_{0.9}Mn_{0.1})_{1.93}$ | 1080° C. | 4 ton/cm2 | 8 mm | 1000° C. | 2 hr | −920 ppm |

EXAMPLE 84

A melted alloy of $Tb_{0.5}$ $Dy_{0.5}$ $(Fe_{0.9}$ $Mn_{0.1})_{1.95}$ was obtained by high frequency induction dissolution in an argon atmosphere using a BN crucible. A stainless steel pipe, 30 mm in outer diameter and 3 mm in thickness, was placed the mold having a 30 mm inner diameter. The mold and pipe were heated to 1100° C. by a carbon heater, the melted alloy was poured into the pipe and cooled in the mold. A stainless steel covered alloy ingot was obtained. A water-cooled cooper plate was used as a cooling plate on which to start the crystal growth.

Figure 10:
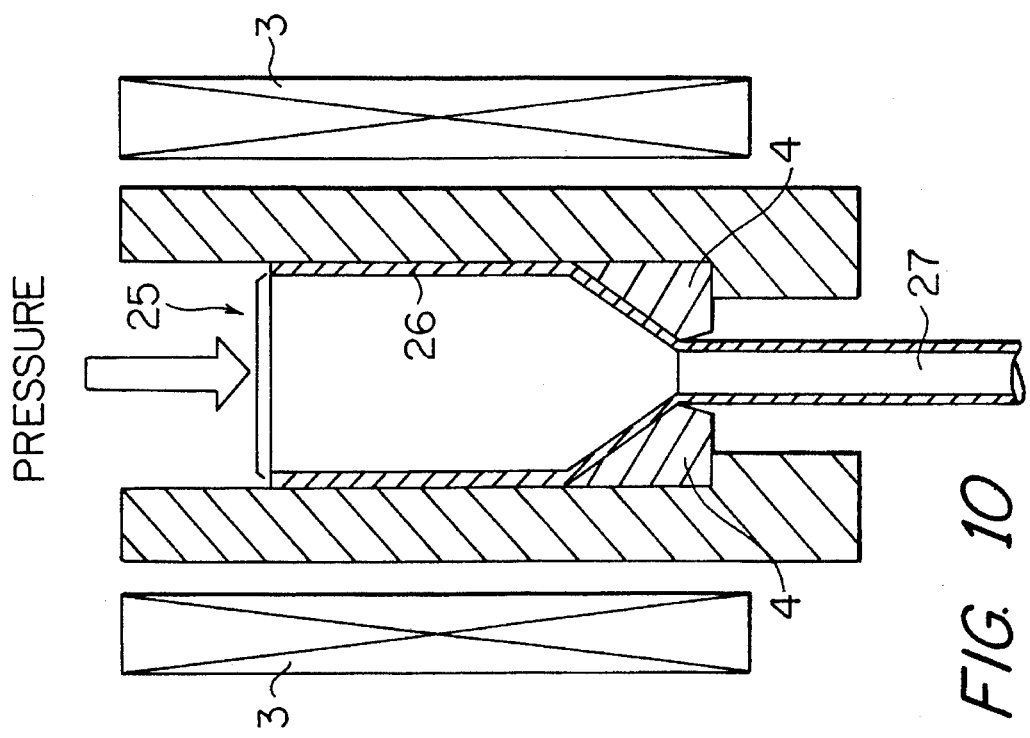
FIG. 9 and FIG. 10 are cross-sectional views of the mold used in the examples of the third embodiment of the invention.

The stainless steel covered magnetostrictive alloy ingot was processed by the hot extruding at a working temperature 1050° C. and extruding pressure 4 ton/cm$^2$ using the equipment shown in FIG. 10. A stainless steel covered magnetostrictive alloy rod 8 mm in diameter was obtained. As shown in FIG. 10, the ingot 25 was pressed and formed into a rod 27 with heaters 3 providing the elevated temperature and dies 4 creating the forming pressure.

This stainless steel covered super magnetostrictive alloy rod was processed to a 6 mm cube and the magnetostrictive characteristic in the extruding (axial) direction and the right angle direction was evaluated at a room temperature using a strain gauge. The magnetic field was produced with a dipole magnet and the magnetostriction (λ) in the 2 kOe magnetic field was measured. The magnetostrictive characteristic obtained was 980 pm in the extruding axial direction and 390 ppm in the right angle direction.

Further, a compression fatigue test was conducted on the rod shaped 8 mm in diameter and 15 mm in length. After applying stress of 5 kg/cm$^2$ repetitively 107 cycles, no cracks or breaks were detected in the sample.

The present invention has been described with respect to specific embodiments. The present invention is, however, not limited thereto. The scope of the invention is to be determined by the appended claims and their equivalents.

We claim:

1. A method of forming a magnetostrictive alloy including the steps of:
   (a) casting said alloy in a heated mold;
   (b) providing a temperature gradient in said mold;
   (c) solidifying said alloy in said mold to form a solidified alloy; and
   (d) plastically deforming said alloy by hot working.

2. The method of claim 1, including the step of covering said solidified alloy prior to hot working.

3. The method of claim 1, further comprising the step of:
   (d) growing said alloy in the <110> direction.

4. The method of claim 1, wherein the alloy is comprised of a composition whose atomic ratio is expressed by:

$$Re\ Fe_p$$

where $1.7 \leq p \leq 2.2$ and Re is one or more rare earth elements selected from the group consisting of Y, La, Ce, Pr, Nd, Pm, Sm, Eu, Gd, Tb, Dy, Ho, Er, Tm, Yb, and Lu.

5. The method of claim 1, wherein the mold is equipped with a heater to heat the side of the mold and a cooling plate at the bottom of the mold.

6. The method of claim 5, wherein the material of the cooling plate is selected from a group consisting of Fe and Cu.

7. The method of claim 5, wherein the cooling plate is water cooled.

8. The method of claim 1, wherein the mold has a narrow opening in the bottom of the mold.

9. The method of claim 8, wherein the mold has a pouring basin at the end of the opening.

10. The method of claim 1, wherein the material of the mold is selected from a group consisting of alumina, BN, MgO, CaO, and carbon.

11. The method of claim 1, wherein the inner surface of the mold is smooth.

12. The method of claim 1, wherein the inner surface of the mold is coated with a separating agent.

13. The method of claim 12, wherein the separating agent is BN.

14. The method of claim 1, wherein the side of the mold is heated at the eutectic temperature of the magnetostrictive material or above.

15. The method of claim 14, wherein the side of the mold is heated within a range from the eutectic temperature of the magnetostrictive material to a temperature of 100° C. more than the melting point of the material.

16. The method of claim 1, wherein the side of the mold is heated with a temperature gradient from the upper portion to the lower portion.

* * * * *